United States Patent [19]

Prigge et al.

[11] Patent Number: 5,051,117
[45] Date of Patent: Sep. 24, 1991

[54] PROCESS FOR REMOVING GASEOUS CONTAMINATING COMPOUNDS FROM CARRIER GASES CONTAINING HALOSILANE COMPOUNDS

[75] Inventors: Helene Prigge, Unterschleissheim; Robert Rurländer, Halsbach; Harald Hoffman, Burghausen; Hans-Peter Bortner, Emmerting, all of Fed. Rep. of Germany

[73] Assignee: Wacker-Chemitronic Gesellschaft fur Elektronik-Grundstoffe mbH, Burghausen, Fed. Rep. of Germany

[21] Appl. No.: 631,190

[22] Filed: Dec. 20, 1990

Related U.S. Application Data

[63] Continuation of Ser. No. 418,081, Oct. 6, 1989, abandoned.

[30] Foreign Application Priority Data

Dec. 22, 1988 [DE] Fed. Rep. of Germany ....... 3843313

[51] Int. Cl.$^5$ ............................................. B01D 53/04
[52] U.S. Cl. ........................................... 55/58; 55/71; 55/72; 55/75
[58] Field of Search .................. 55/58, 71, 72, 75; 423/240, 342, 347

[56] References Cited

U.S. PATENT DOCUMENTS

| 2,971,607 | 2/1961 | Caswell | 55/75 |
|---|---|---|---|
| 2,971,607 | 2/1961 | Caswell | 55/75 |
| 3,658,696 | 4/1972 | Shively et al. | 55/75 X |
| 3,698,157 | 10/1072 | Allen et al. | 55/75 X |
| 3,982,912 | 9/1976 | Yatsurugi et al. | 55/75 X |
| 4,019,879 | 4/1977 | Rabo et al. | 55/75 X |
| 4,019,880 | 4/1977 | Rabo et al. | 55/75 X |
| 4,099,936 | 7/1978 | Tarancon | 55/75 |
| 4,224,040 | 9/1980 | Gazzarrini et al. | 55/72 X |
| 4,257,885 | 3/1981 | Grose et al. | 55/75 X |
| 4,309,259 | 1/1982 | Sarma et al. | 423/342 X |
| 4,414,005 | 11/1983 | DeBiévre et al. | 55/75 |
| 4,454,104 | 6/1984 | Griesshammer et al. | 55/71 X |
| 4,477,267 | 10/1084 | Reiss | 55/75 X |
| 4,554,141 | 11/1985 | Scull et al. | 55/75 |
| 4,557,921 | 12/1985 | Kirsch et al. | 55/71 X |
| 4,663,052 | 5/1987 | Sherman et al. | 55/75 X |
| 4,676,967 | 6/1987 | Breneman | 423/347 |
| 4,735,786 | 4/1988 | Inoue et al. | 423/240 S |
| 4,744,221 | 5/1988 | Knollmueller | 55/74 X |
| 4,748,013 | 5/1988 | Saito et al. | 55/71 X |
| 4,772,296 | 9/1988 | Potts | 55/72 X |

FOREIGN PATENT DOCUMENTS 52-099071 8/1978 Japan ....................... 55/72

OTHER PUBLICATIONS

Kirk-Othmer, *Encyclopedia of Chemical Technology*, title page and pp. 123–124, third edition, vol. 8.

*Primary Examiner*—Robert Spitzer
*Attorney, Agent, or Firm*—Collard, Roe & Galgano

[57] ABSTRACT

A process for removing contaminants, particularly dopant, from halosilane-containing carrier gases, such as those which are produced in the production of high-purity silicon. The process of the invention is perferably carried out with aid of zeolites which has a low proportion of aluminum and are used in the anhydrous state by bringing the zeolites into contact with the carrier gases. Zeolites, after use, can be regenerated and re-used by increasing the temperature and/or decreasing the pressure of the procedure.

12 Claims, No Drawings

PROCESS FOR REMOVING GASEOUS CONTAMINATING COMPOUNDS FROM CARRIER GASES CONTAINING HALOSILANE COMPOUNDS

This is a continuation of copending application Ser. No. 07/418,081 filed on Oct. 6, 1989, now abandoned.

This present invention relates to a process for removing gaseous contaminating compounds, such as dopant, from carrier gases (e.g., hydrogen) containing gaseous or vaporous halosilane compounds and also, possibly, hydrogen halides.

Heretofore, the prior art has included many processes connected with the production of polycrystalline high-purity silicon by gas-phase deposition, for example, by decomposition of volatile silicon compounds on heated silicon carrier bodies by the Siemens process; on silicon particles dispersed in a fluidized bed, in the epitaxial deposition of silicon layers; or, in the conversion of silicon tetrachloride into hydrogen-containing silanes. The reactions involved do not, as a rule, proceed quantitatively. The gas mixtures produced as final products in these processes contain, in addition to newly formed gaseous reaction products, a greater or lesser proportion of the starting products and also the carrier gas employed, generally, hydrogen or a noble gas, for example, argon. The reuse, at least of some constituents, of these gas mixtures is extremely desirable in order to exploit the available resources as undemandingly as possible and to avoid the production of waste substances.

An obstacle to such a reutilization is, however, the fact that it is associated, in most cases, with an enrichment of contaminating substances, particularly dopant, in the gas phase owing to the unfavorably situated partition equilibria. This applies primarily to n-type doping impurities which may occur, for example, in the form of volatile compounds of elements of the fifth main group of the periodic system. Examples include halogen compounds or, in particular, hydrogen compounds of phosphorus or arsenic. Further examples include the p-type doping impurities based on volatile boron compounds or aluminum compounds. The enrichment effect makes itself unfavorably manifest, particularly in the case of those gases which are frequently employed successively or cyclically such as, for example, hydrogen, which acts substantially as a carrier gas and only to a lesser extent as a reactant, or, alternatively, noble gases, such as argon, which are inert as carrier gases. Examples of other contaminating impurities which may occur in such carrier gases are hydrocarbons such as, for instance, ethylene or halogenated hydrocarbons. Examples of such halogenated hydrocarbons include dichloroethane, as a source of which, for example, graphite may be suitable. Additionally, volatile metal halides may be liberated, for example, under certain circumstances from steels, such as, iron chloride or titanium chloride.

For the purpose of reusing these carrier gases it is therefore important to remove such volatile contaminating compounds, particularly dopant compounds, as completely as possible. This, however, is made difficult by the fact that, generally, the carrier gases contain at least traces of halosilanes and, frequently, also hydrogen halides, e.g., acidic components, which may appreciably interfere with the removal owing to their high reactivity. In the procedure according to F.R.G. Patent Application No. 2,755,824, or the corresponding U.S. Pat. No. 4,099,936 (which is, however, aimed at the purification of silane) these components are first adsorbed in a complicated procedure by a distillation step followed by adsorption on active charcoal at low temperatures, before the arsenic hydride and phosphorus hydride are subsequently bonded to porous magnesium silicate at, likewise, very low temperature. The procedure according to F.R.G. Patent Application No. 1,095,796 (corresponding to U.S. Pat. No. 2,971,607) also relates only to silane, from which volatile compounds of arsenic, phosphorus and boron are removed with the aid of zeolite (A or X) at temperatures below 0° C. and pressures below atmospheric pressure.

It is, therefore, an object of the present invention to provide a process by which gaseous contaminating compounds, particularly dopant compounds, can be removed from carrier gases, such as those which are employed in the deposition of elementary high-purity silicon, from the gas phase, or in the production of starting products therefor, which contain, at least in traces, halosilanes and also, possibly hydrogen halides, i.e., acidic components.

It is a further object of the present invention to provide a process for removing gaseous containing compounds from carrier gases containing halosilane compounds which is simple to carry out and may be performed under readily accessible conditions with a low usage of chemicals.

The foregoing and related objects are achieved by a process which comprises bringing the carrier gases into contact with zeolites of the composition $M_{2/n}O \cdot Al_2O_3 \cdot xSiO_2 \cdot yH_2O$; where M is an element from the 1st or 2nd main group of the Mendeleyev periodic system of elements or $NH_4$; n corresponds to the valency of this element; the molar ratio $x = SiO_2/Al_2O_3$ is at least 2 and the value of y tends to zero.

Zeolites, or molecular sieves as they are often also called, have been known for a long time and are available commercially. They are available partly from occurrences in natural deposits and partly also through synthetic production. Generally, they are silicates (mostly alkali-metal or alkaline-earth aluminosilicates) which are composed of a structure of tetrahedra linked by oxygen bridges, and in particular, in a manner such as to produce a spatial arrangement of cavities of identical construction which are accessible via mutually equally large pore openings or channels. Zeolites, can be distinguished and characterized, for example, by X-ray examination on the basis of their diffraction pattern. Important characteristic parameters are, furthermore, the pore size and the molar $SiO_2/Al_2O_3$ ratio, according to which, for example, synthetic zeolites can be divided up into different type categories (for example, A, X, Y and ZSM type). More detailed explanations concerning zeolites are to be found in the paper entitled "Zeolithe—Eigenschaften und technische Anwendungen" ("Zeolites—Properties and Technical Applications") by L. Puppe which has appeared in Chemie uns. Zeit 20 (1986), pages 117–127 and also in the literature cited therein.

In the zeolites used according to the invention, preferred elements M of the 1st and 2nd main group of the Mendeleyev periodic system of elements are sodium, potassium, magnesium and calcium, in particular, the sodium-rich and/or calcium-rich forms, or mixed forms, of the zeolites rich in both of these elements. Zeolites in which M is hydrogen or ammonium are advantageously used in those cases in which particular attention has to be paid to carefully excluding interfering cations. In such instance, the hydrogen is not physically bound in the water, which can be removed by dehydration, but in a form which is chemically firmly bound to the structure.

It is important that the content of physically bound water, which is represented in the formula specified above by "$yH_2O$", in the zeolites is as low as possible, i.e. tends to zero or, in the ideal case, is even equal to zero. The zeolites are therefore used in their anhydrous form, a residual proportion of water of about 0.1% by weight having proved to be still tolerable as a maximum. At the same time, zeolites produced in anhydrous form may be used; in principle, however, it is also possible to dehydrate zeolites originally received in the hydrated state prior to use. Such a dehydration may be achieved, for example, by a temperature treatment such as, for instance, heating for several hours at 100° to 400° C., preferably 200° to 400° C., it being possible, additionally or alternatively thereto to also carry out a treatment at reduced pressure. Zeolites converted to the anhydrous state in this manner, or already received in anhydrous form, have proven to be particularly stable and effective under the claimed process conditions, which are often very aggressive. The anhydrousness of the zeolite may, for example, be tested with the aid of a weighing procedure in which the water absorption from a stream of inert gas, for example of nitrogen, which is passed through the zeolite at high temperatures, is measured (for example, indirectly via the increase in weight of a drying agent exposed thereto). The zeolite may be regarded as anhydrous if an increase can no longer be detected.

The use of low-aluminum zeolites, i.e., those in which the molar ratio $SiO_2/Al_2O_3$ is at least 2, preferably 2.4 to 120, has also proven to be advantageous. In the limiting case, said ratio may even assume the infinite value, i.e., if aluminum-free zeolites are used. In this case, the risk of a fresh contamination of the carrier gas to be purified by aluminum from the zeolite which is, after all, basically also a doping impurity, the lowest.

The unobstructed pore size of the suitable zeolites is between 4 and 20 Å and is preferably 5 to 10 Å. In this pore size range, a particularly effective bonding of the contaminating, in particular dopant, compounds contained in the carrier gases by the zeolites has been found, in contrast to which its often observed displacement from the bonding by halosilanes or hydrogen halides, also present in the gas phase, is low. As a rule, the unobstructed pore sizes can presently be found in the specifications of the manufacturers. If necessary, the pore sizes may also be determined analytically or checked, for example, by X-ray structural analysis or by comparison of the diffraction patterns with those of known standard specimens.

Examples of zeolites which are in principle suitable for use in the procedure are synthetic zeolites such as, for example, those of the type X, of the type Y or of the Pentasil type, such as, for example, the ZSM 5 or ZSM 11 zeolites. As a suitable naturally occurring zeolite, mention may be made, for example, of chabazite. Generally, the zeolites may be used either in the powdered or in the granulated form.

The process of the present invention is suitable for use in removing contaminating compounds, particularly dopant from gas mixtures, such as those which are produced in the production of elementary high-purity silicon via the gas phase or in the epitaxial deposition of silicon from the gas phase. The process is also useful in removing compounds used in the production of starting products for the foregoing reactions.

The relevant gas mixtures contain one or more carrier gases such as noble gases or, in particular, hydrogen, which may also be partially involved in the reactions, and also contain proportions of halosilanes and hydrogen halides as acidic components. A typical example of such gas mixtures is the gas mixture produced in the deposition of silicon by decomposition of trichlorosilane/hydrogen mixtures at heated carrier bodies (for example, composed of silicon or graphite film) and which contain, in addition to hydrogen, mostly present in proportions of 70 to 99.9% by volume, unreacted trichlorosilane, silicon tetrachloride produced in the reaction (possibly higher chlorosilanes) and hydrogen chloride. Such gas mixtures also include volatile contaminating, in particular, dopant, compounds. Such gas mixtures may also be used in an already treated form, i.e. such mixtures have already passed through a treatment step in which, for example, the chlorosilanes were removed by freezing out or, for example, another absorptive separation operation, down to traces, i.e. down to about 0.1% by volume, from the hydrogen. A similar example is the gas mixture produced in the so-called tetra conversion; the conversion of silicon tetrachloride/hydrogen mixtures into hydrogen-containing silane compounds, in particular trichlorosilane, whose main component is hydrogen in proportions of about 70 to 99.9% by volume. Other examples are the gas mixtures which are used in epitaxial deposition from the gas phase and which contain as a carrier gas, usually a noble gas, preferably argon, and, in addition thereto, chlorosilanes, such as dichlorosilane, as silicon-releasing gases, or the gas mixtures which are used in the fluidized bed deposition of silicon on silicon particles dispersed in a fluidized bed and in which monosilane, chlorosilanes or bromosilanes are normally used as volatile silicon compounds in addition to hydrogen or argon as the carrier gas. For reasons of simplicity, such suitable gas mixtures are described below only as carrier gases without specifying their precise composition.

The claimed process makes it possible to remove, in particular, n-type doping impurities present in the gaseous or vaporous state, in addition to those having p-type doping action, from the carrier gases to be treated. Examples are the volatile hydrogen or halogen compounds, in particular chlorocompounds of the elements of the fifth main group of the Mendeleyev periodic system of elements, in particular, phosphine. Volatile compounds of elements of the third main group such as, for instance, aluminum halides, which have p-type doping action, can also be removed therewith. The procedure is also suitable for removing other contaminating gaseous compounds such as, for instance, hydrocarbons or halogenated hydrocarbons, for example ethylene or dichloroethane, respectively, or the volatile metal halides, of which iron chloride or titanium chloride may be mentioned by way of example.

In the process of the present invention, the zeolite selected in each case is taken in a form which makes possible an intensive contact with the gases to be purified. Suitable methods for this purpose are known from conventional adsorption procedures in which the bonding of gaseous substances contained in a gas phase to a solid adsorbent is involved. Preferably, the zeolite is taken as a stationary phase in an adsorption tube made of, for example, Duran glass, quartz glass or corrosion-proof stainless steel, through which the carrier gas to be purified flows; it being possible to provide in addition, if necessary, retaining devices at the gas outlet side, such as, for example, dust filters. In principle, a plurality of such adsorption tubes may be connected in sequence in the gas stream. Another possibility is to allow the gas stream to pass over a solid bed of the zeolite. The use of fluidized beds is also not excluded.

A particular advantage of the process of the claimed invention, is that it can be carried out at readily accessible mild temperatures. Preferably, the zeolite taken is kept at room temperature, that is to say, in a temperature range of from 15° to 25° C. when it comes into contact with the carrier gas to be treated. Generally, a temperature range of from 0° to 50° C. has proved to be suitable; at lower temperatures undesirable condensation phenomena may already occur, while at higher temperatures the bonding power of the zeolites begins to decrease noticeably.

Suitable pressures are in the range of from 0.5 to 10 bar, preferably 1 to 2 bar. At the same time the upper limit is basically set by equipment limitations, but also by a tendency of individual components in the gas phase to liquefy. The flow rate, at which the carrier gas to be purified is brought into contact with the zeolites taken, also depends on the equipment attributes and are advantageously determined in accordance therewith in preliminary experiments.

A further advantage of the invention is that the zeolites, whose adsorption capacity for the contaminating compounds, particularly dopant, has been exhausted, can be regenerated and thereafter may be used again to remove such compounds from the carrier gases. The regeneration may be carried out in a particularly advantageous manner by raising the temperature of the zeolites to 50° to 300° C., preferably 200° to 300° C. In this case, the zeolites to be regenerated may be removed and treated in a separate regeneration position. Equally, however, it is also possible to regenerate the zeolites at their point of use, for example, if they are placed in a heatable adsorption tube. In this case, the supply of the carrier gas is interrupted for the duration of the regeneration, the stream of carrier gas in the meantime being passed, according to a particularly elegant variant of the procedure, through an adsorption equipment, arranged in parallel, which is loaded with zeolites and which can then, subsequently, be regenerated in an analogous manner. In this manner, the treatment of the carrier gases may be carried out on a continuous basis.

The regeneration of the zeolites may also be promoted by lowering the pressure to values below the working pressure, preferably below 0.1 bar, simultaneously with the increase in temperature. In principle, this reduction in pressure can even be carried out without an increase in temperature and, in particular, if temperature-sensitive zeolites or contaminating or dopant compounds are present, which decompose at elevated temperatures and thereby make it difficult to reuse the zeolites. Another method of regeneration, which can also be used, particularly, in the case of temperature-sensitive zeolites, is provided by the pressure load cycling procedures which are conventionally known and are carried out in a stream of inert gas.

The volatile dopant compounds released during the regeneration such as, for instance, phosphorus hydride or arsenic hydride may, for example, be rendered harmless by reaction with suitable reagents such as, for instance, by passing into sodium hydroxide solution. Another possibility is to collect and enrich these chemicals, which are also valuable in and of themselves, in order to be able to reuse them, for example, as dopants.

The regenerated zeolites may be brought into contact again with the carrier gases to be purified and again have the capability of bonding the volatile contaminating compounds, particularly dopant compounds, contained therein. They may also be regenerated again after repeated adsorption so that a virtually unlimited possibility of reuse ultimately results. The usage of chemicals necessary is therefore extremely low in the case of the process of the present invention. The adsorption state of the zeolites can also readily be tracked with the aid of detectors such as, for instance, thermal conductivity detectors or photoionization detectors, which compare the proportion of the contaminating compounds before and after the contact of the carrier gas with the zeolite. If the content at the outlet side rises above a permissible limiting value, the next regeneration can be carried out after interrupting the further supply of carrier gas. The intervals between the individual regeneration steps may also be assessed on the basis of the capacity of the zeolites and the content of gaseous doping or contaminating compounds in the carrier gases, and also, after preliminary experiments.

The process according to the invention consequently therefore makes it possible to remove volatile contaminating compounds, particularly dopant, from carrier gas compositions which are difficult to treat with little expenditure on equipment, with low requirements for chemicals and under mild conditions.

The present invention will now be described in further detail with reference being made to the following examples. It should, however, be recognized that the following examples are intended as merely illustrating the scope of the present invention and are not intended as defining the scope thereof.

EXAMPLE 1

A stainless-steel adsorption tube (diameter approx. 2 cm) was filled with approx. 500 g of pellets of a commercially standard zeolite of type X (Ca-rich form, pore size approx. 8 Å, x=2.4). Next, the tube was heated to a temperature of approx. 370° C. for about 2 hours in order to activate and completely dehydrate the zeolite; in this case, a slight vacuum (approx. 0.4 bar abs.) was simultaneously applied.

The tube was then inserted in the stream of carrier gas to be purified. The carrier gas was composed of hydrogen and contained approx. 1% by volume of chlorosilanes (principally silicon tetrachloride and trichlorosilane in approximately equal proportions), approx. 1% by volume of hydrogen chloride and also traces of phosphorus hydride (approx. 1 ppm). While flowing through the adsorption tube, the gas stream had a temperature of about 20° C. and was under a pressure of approx. 2 bar; the flow rate was approx. 3-6 l/min (under standard conditions).

These conditions were maintained for about 10 hours; the phosphorus content of the gas stream leaving the adsorption tube being determined by means of an enrichment procedure (deposition of a silicon film and determination of its phosphorus content). This revealed a reduction in the phosphine content of approx. 55%, based on the phosphine content of the untreated carrier gas.

After 10 hours, the passage of the carrier gas to be treated was interrupted, and instead thereof, a stream of pure hydrogen was applied. The temperature was simultaneously raised to about 230° C. with a rate of rise of about 15° C./min, while the pressure was reduced to approx. 0.02 bar. Under these conditions, the phosphine bound to the zeolite was released again and discharged with the stream of hydrogen. This regeneration phase was stopped after about 1.5 hours. It was then possible to inset the zeolite in the absorption tube into the stream of carrier gas again and use it to remove phosphine.

EXAMPLE 2

About 5 g of the Pentasil zeolite ZSM 11 (pore size approx. 5.5 Å, x=110, M=Na and also traces of H) in calcined form was loaded into a Duran glass adsorption tube (diameter approx. 1.5 cm, length approx. 30 cm). The tube was fitted with a filter plate on the gas inlet side and sealed against dust discharge on the gas outlet side with quartz wool. An internal thermometer was additionally incorporated to monitor the temperature.

First the zeolite in the adsorption tube was evacuated and heated to about 230° C. for approx. 6 hours for the purpose of activation and dehydration. This was followed by a purging with dry hydrogen for a further 2 hours, after which it was no longer possible to detect moisture absorption by the gas stream; this ensured that the zeolite was present in the anhydrous state.

The temperature in the adsorption tube was now adjusted to about 20° C. and the passage through it of a stream of hydrogen, which additionally contained about 30 ppm of phosphorus hydride and also traces of trichlorosilane (approx. 1 to 10 ppm) which had remained in the gas phase as a residual proportion after a preceding treatment step to remove the chlorosilane by freezing out, was started. The flow rate was adjusted to approx. 1.5 ml/sec.

The proportion of phosphorus hydride in the gas stream leaving the adsorption tube was monitored with the aid of a gas chromatograph; it was less than 10 ppb, the limit of detection of the equipment. This level only began to rise after 12 hours, from which it was possible to detect that the adsorption capacity of the zeolite was exhausted.

For the purpose of regeneration, after interrupting the supply of the contaminated hydrogen gas, the temperature in the adsorption tube was now raised to about 150° C. and pure hydrogen was passed through it. Under these circumstances, the phosphorus hydride adsorbed on the zeolite was rapidly given off again and discharged with the stream of hydrogen. After about one hour, it was no longer possible to detect $PH_3$ in the hydrogen; the treatment was therefore terminated and the zeolite was available for reuse.

In a comparison experiment, the adsorption tube was kept at a temperature of about 100° C. during the adsorption process under otherwise identical conditions. In this case, the increase in the proportion of phosphorus hydride in the gas stream leaving the adsorption tube set in after only 9.6 minutes.

While only several embodiments of the present invention have been described, it will be obvious to those of ordinary skill in the art that many modifications may be made to the present invention without departing from the spirit and scope thereof.

What is claimed is:

1. A process for removing gaseous contamination selected from the group consisting of n-type doping impurities, p-type doping impurities, hydrocarbons, halogenated hydrocarbons, volatile metal halides, from a carrier gas selected from the group consisting of noble gases and hydrogen, containing halosilane compounds, comprising the steps of:

bringing the carrier gas into contact with a zeolite of the composition $M_{2/n}O.Al_2O_3.x \; SiO_2.y \; H_2O$ wherein, M represents an element from Group I or Group II of the Mendeleyev Periodic Table of elements, or represents $NH_4$;

n corresponds to the valency of M;

x in which the molar ratio $x = SiO_2/Al_2O_3$ is at least 2; and, y has a value tending toward zero, said zeolite having an unobstructed pore size of 4–20 Å;

said zeolite being a member selected from the group consisting of zeolite X, zeolite Y, chabazite, pentasil and a combination thereof;

adsorbing, at least partially, the said contamination to the said zeolite; and recovering the said carrier gas containing halosilane compounds.

2. The process according to claim 1, wherein said zeolite has a molar ratio of x of between 2.4 and 120.

3. The process according to claim 1, wherein said bringing into contact step is carried out at a temperature of 0° to 50° C.

4. The process according to claim 1, wherein said bringing into contact step is carried out at a pressure of 0.5 to 10 bar.

5. The process according to claim 1, further comprising the steps of:

periodically removing said zeolite from contact with the carrier gas;

regenerating said zeolite; and, re-contacting said zeolite with the carrier gas.

6. The process according to claim 5, wherein said regenerating of said zeolite is carried out by an increase in temperature.

7. The process according to claim 6, wherein the temperature of said zeolite is increased to 50°–300° C.

8. The process according to claim 5, wherein said regenerating of said zeolite is carried out by a change in pressure.

9. The process according to claim 8, wherein said regenerating of said zeolite is carried out by a reduction in pressure.

10. The process according to claim 1, wherein said zeolite has an unobstructed pore size of 5.5–20 Å.

11. A process for removing gaseous contamination selected from the group consisting of n-type doping impurities, p-type doping impurities, hydrocarbons, halogenated hydrocarbons, volatile metal halides, from a carrier gas selected from the group consisting of noble gases and hydrogen, containing halosilane compounds, comprising the steps of:

bringing the carrier gas into contact with a zeolite of the composition $M_{2/n}O.Al_2O_3.x \; SiO_2.y \; H_2O$ wherein, M represents an element from the Group I or Group II of the Mendeleyev Periodic Table of elements, or represents $NH_4$;

n corresponds to the valency of M;

x in which the molar ratio $x = SiO_2/Al_2O_3$ is between 2.4 and 120, and y has a value tending toward zero, said zeolite being a member selected from the group consisting of zeolite X, zeolite Y, chabazite, pentasil and a combination thereof;

said zeolite having an unobstructed pore size of 5.5-20 Å, said bringing into contact step is carried out at a temperature of 0° to 50° C., said bringing into contact step is carried out at a pressure of 0.5 to 10 bar;

adsorbing, at least partially, the said contamination to the said zeolite; and recovering the said carrier gas containing the halosilane compounds.

12. The process according to claim 11, wherein said zeolite has an unobstructed pore size of 8-20 Å.

* * * * *